(12) United States Patent
Lin et al.

(10) Patent No.: US 10,861,861 B2
(45) Date of Patent: Dec. 8, 2020

(54) MEMORY INCLUDING A PEROVSKITE MATERIAL

(71) Applicant: Intel Corporation, Santa Clara, CA (US)

(72) Inventors: Chia-Ching Lin, Portland, OR (US); Sasikanth Manipatruni, Portland, OR (US); Tanay Gosavi, Hillsboro, OR (US); Dmitri Nikonov, Beaverton, OR (US); Sou-Chi Chang, Portland, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 16/221,083

(22) Filed: Dec. 14, 2018

(65) Prior Publication Data

US 2020/0194444 A1    Jun. 18, 2020

(51) Int. Cl.
  *H01L 27/11509*  (2017.01)
  *H01L 27/11592*  (2017.01)
(52) U.S. Cl.
  CPC .. *H01L 27/11509* (2013.01); *H01L 27/11592* (2013.01)
(58) Field of Classification Search
  CPC .................. H01L 27/11509; H01L 27/11592
  See application file for complete search history.

(56) References Cited

U.S. PATENT DOCUMENTS

| 6,083,788 A | * | 7/2000 | Lian | H01L 21/768 |
| | | | | 438/253 |
| 2004/0061153 A1 | * | 4/2004 | Misewich | H01L 27/11585 |
| | | | | 257/295 |

(Continued)

FOREIGN PATENT DOCUMENTS

WO    2018125024 A1    7/2018

OTHER PUBLICATIONS

Cutress, "Intel and Micron to Dissolve 3D XPoint Partnership after 2019", AnandTech, Jul. 16, 2018, three pages, https://www.anandtech.com/show/13083/intel-and-micron-update-3d-xpoint-roadmap-combined-effort-2nd-gen-3rd-gen-separate.

(Continued)

*Primary Examiner* — Mohammed Shamsuzzaman
*Assistant Examiner* — Khatib A Rahman
(74) *Attorney, Agent, or Firm* — Trop, Pruner & Hu, P.C.

(57) ABSTRACT

An embodiment includes a system comprising: first, second, third, fourth, fifth, and sixth layers, (a) the second, third, fourth, and fifth layers being between the first and sixth layers, and (b) the fourth layer being between the third and fifth layers; a formation between the first and second layers, the formation including: (a) a material that is non-amorphous; and (b) first and second sidewalls; a capacitor between the second and sixth layers, the capacitor including: (a) the third, fourth, and fifth layers, and (b) an electrode that includes the third layer and an additional electrode that includes the fifth layer; and a switching device between the first and sixth layers; wherein: (a) the first layer includes a (Continued)

metal and the sixth layer includes the metal, and (b) the fourth layer includes a Perovskite material. Other embodiments are addressed herein.

19 Claims, 7 Drawing Sheets

(56) References Cited

U.S. PATENT DOCUMENTS

| | | | | |
|---|---|---|---|---|
| 2006/0258113 | A1* | 11/2006 | Sandhu | H01L 27/10811 438/396 |
| 2007/0072310 | A1* | 3/2007 | Kumura | H01L 27/11509 438/3 |
| 2009/0075399 | A1* | 3/2009 | Sakato | H01L 28/65 438/3 |
| 2018/0122478 | A1 | 5/2018 | Morris et al. | |

OTHER PUBLICATIONS

Micheloni et al., "Architectural and Integration Options for 3D NAND Flash Memories", Computers, Aug. 10, 2017, pp. 1-19, vol. 6 Issue 3, MDPI AG, Basel, Switzerland.
Wikipedia, "Charge trap flash", May 30, 2018, nine pages, https://en.wikipedia.org/wiki/Charge_trap_flash.
Wikipedia, "Thin-film transistor", Jun. 28, 2018, three pages, https://en.wikipedia.org/wiki/Thin-film_transistor.
Wikipedia, "System in package", Jun. 29, 2018, two pages, https://en.wikipedia.org/wiki/System_in_package.
Wikipedia, "Package on package", Jun. 24, 2018, four pages, https://en.wikipedia.org/wiki/Package_on_package.
Wikipedia, "Ferroelectric RAM", Aug. 21, 2018, six pages, https://en.wikipedia.org/wiki/Ferroelectric_RAM.
Wikipedia, "Ferroelectricity", Jul. 1, 2018, seven pages, https://en.wikipedia.org/wiki/Ferroelectricity.
Wikipedia, "Flash memory", Aug. 28, 2018, 23 pages, https://en.wikipedia.org/wiki/Flash_memory.
Das, "Intel's Embedded DRAM: New Era of Cache Memory", EE Times, Aug. 7, 2014, six pages, 2018, UBM Electronics, https://www.eetimes.com/author.asp?doc_id=1323410.
James, "The Confab—Semi Industry is Now Mature", Solid State Technology, Dec. 6, 2013, 49 pages, https://electroiq.com/chipworks_real_chips_blog/author/sdavis/page/3/.
James, "Recent Innovations in DRAM Manufacturing", Conference Paper, Aug. 2010, seven pages, Chipworks, Inc.
Tallis, "Micron 3D NAND Status Update", AnandTech, Feb. 12, 2016, four pages, https://www.anandtech.com/show/10028/micron-3d-nand-status-update.
Sheldon, "NAND flash memory basics: Comparing SLC, MLC and TLC NAND", Tech Target, Nov. 20, 2017, three pages, https://searchstorage.techtarget.com/feature/NAND-flash-memory-basics-Comparing-SLC-MLC-and-TLC-NAND.
Walker, "Samsung's 3D V-NAND Flash Product—The Spires of El Dorado?", 3D InCites, Aug. 12, 2014, two pages, https://www.3dincites.com/2014/08/samsungs-3d-vnand-flash-product-spires-el-dorado/.
Tai, et al., "Photosensitivity Analysis of Low-Temperature Poly-Si Thin-Film Transistor Based on the Unit-Lux-Current", IEEE Transactions on Electron Devices, Jan. 2009, pp. 50-56, vol. 56, No. 1, Institute of Electrical and Electronics Engineers.
Alcorn, "WD's Big Advantage: BiCS3 64-Layer 3D NAND Coming This Year", Tom's Hardware, Jul. 26, 2016, three pages, https://www.tomshardware.com/news/wd-sandisk-bics3-64-layer-3d-nand,32328.html.
Polinksy, et al., "Dynamic Random Access Memory—DRAM", Introduction to DRAM Technology, Aug. 28, 2001, 36 pages, Rochester Institute of Technology—Microelectronic Engineering.
Penumatcha, et al., "Vertical Memory Control Circuitry Located in Interconnect Layers," U.S. Appl. No. 16/146,938, filed Sep. 28, 2018.

* cited by examiner

MEMORY INCLUDING A PEROVSKITE MATERIAL

TECHNICAL FIELD

Embodiments of the invention are in the field of semiconductor devices and, in particular, memory.

BACKGROUND

Once semiconductor wafers are prepared, a large number of process steps are still necessary to produce desired semiconductor integrated circuits. In general the steps can be grouped into four areas: Front End Processing, Back End Processing, Test, and Packaging.

Front end processing (sometimes referred to as "frontend") refers to the initial steps in the fabrication. In this stage semiconductor devices (e.g., transistors) may be created in a wafer. For example, a front end process may include: preparation of the wafer surface, patterning and subsequent implantation of dopants to obtain desired electrical properties, growth or deposition of a gate dielectric, and growth or deposition of insulating materials to isolate neighboring devices.

Once the front end semiconductor devices have been created they may be interconnected to form electrical circuits. This "Back End Processing" (sometimes referred to as "backend") involves depositing various layers of metal and insulating material in the desired pattern. Typically the metal layers consist of aluminum, copper, and the like. The insulating material may include oxides, low-K materials, and the like. The various metal layers are interconnected by interconnects, which may include a line portion (sometimes referred to as a trace or wire) and a via portion. Vias may be formed by etching holes in the insulating material and depositing metal (e.g., Tungsten) in them. The line portion may be formed by etching trenches in the insulating material and depositing metal in them.

Once the back end processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

The back end is increasingly being used for far more than interconnect routing. For example, memory cells are now being formed within the backend layers to increase the density of memory arrays.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in an image, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Phrases such as "comprising at least one of A and B" include situations with A, B, or A and B.

As mentioned above, memory cells are now being included within the back end layers to increase memory density. Applicant determined ferroelectric Perovskite materials may be a material for these memory cells, cells which may be included in embedded memory (e.g., embedded DRAM) and/or high bandwidth memory due to the low switching voltage and high polarization of Perovskite materials. While Perovskite materials can be grown on bare silicon wafers, Applicant determined it is much more difficult to form such materials within the back end layers. Applicant determined this difficulty is due at least in part to the difficulty of forming Perovskite materials within trenches formed in the dielectric layers of the back end. Such dielectric layers lack the non-amorphous crystal structure that promotes Perovskite material growth. Thus, using Perovskite materials in back end capacitors (which are used in, for example, back end memory cells) is difficult because such capacitors are often formed in high aspect ratio trenches created within the dielectric layers of the back end. Applicant determined that even using an intermediate layer between the Perovskite materials and the dielectric materials can be difficult because forming uniformly thick intermediate layers (e.g., seed layers) in high aspect ratio (e.g. 4:1 or greater height:width ratio) trenches is difficult.

However, an embodiment addresses these shortcomings by utilizing a reverse process integration flow. Such a process forms the Perovskite materials on a pillar or island instead of within a trench. This pillar or island acts as a template for growing Perovskite materials. Thus, high quality Perovskite materials can be formed on the island area, following by an interlayer dielectric (ILD) process. Embodiments provide numerous advantages. For example, ferroelectric Perovskite materials are materials with high polarization and low switching voltage. High polarization equates to a smaller required memory cell size. Low switching voltage leads to lower operation voltage, which means ferroelectric Perovskite materials help enable embedded memory and high bandwidth memory.

Figure 1A:
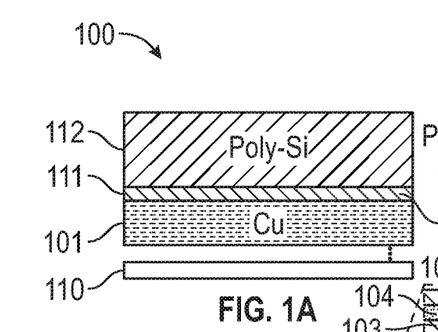
FIGS. 1(A)-1(I) include a process for forming Perovskite material-based back end memory systems in an embodiment.

FIGS. 1(A)-1(I) provide an embodiment of a process for forming Perovskite material-based back end memory. The method 100 includes (FIG. 1(A)) providing a substrate 110 and forming a first layer 101 on the substrate. Layer 101 may include a "metal layer" of the back end. The first layer 101 may include a metal such as at least one of copper, aluminum, cobalt, tungsten, silver, gold, tantalum, nickel, graphene, or combinations thereof. An additional layer 111, such as a diffusion barrier layer, may be formed on the first layer. Layer 111 may include tantalum nitride (TaN) or some other barrier material. Layer 111 may be formed using, for example, chemical vapor deposition (CVD), physical vapor deposition (PVD), and/or atomic layer deposition (ALD). FIG. 1(A) also shows forming a non-amorphous material 112 on the first layer 101. Layer 112 may include, for example, polysilicon.

As used herein, a non-amorphous material may include polysilicon and the like. By contrast, an amorphous material includes non-crystalline solids. Such amorphous materials have no periodicity or long-range order at all. Amorphous materials include, for example, dielectrics such as $SiO_2$ and $Si_3N_4$.

Figure 1B:
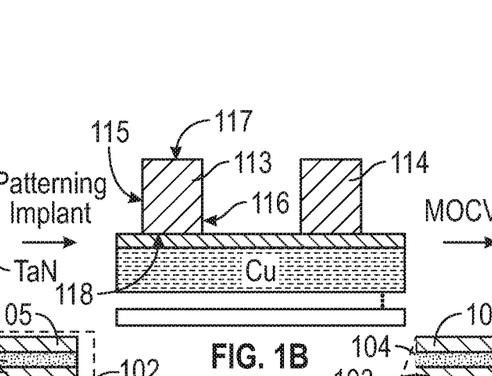

FIG. 1(B) includes forming a pillar or pillars 113, 114 on the first layer 101. The pillars are formed from material 112. Pillar 113, for example, includes first and second sidewalls 115, 116 that oppose one another. Pillar 113 includes first and second opposing surfaces 117, 118. The first surface 117 couples the first and second sidewalls 115, 116 to one another and the second surface 118 also couples the first and second sidewalls 115, 116 to one another. In an embodiment, a majority (>50%) of the material of the pillar 113 is non-amorphous. For example, pillar 113 may be primarily composed of polysilicon despite having dopants also within the pillar. Regarding dopants, FIG. 1(B) also indicates that in an embodiment the pillars 113, 114 may be doped with an implant. In various embodiments the material of pillar 113 (and material 112) may include, for example, doped Si, doped Ge, doped GaAs, doped InP, doped sapphire, or combinations thereof. As a result, the pillar may eventually form a portion of a memory circuit. For example, pillar 113 may form a bit line.

Figure 1C:
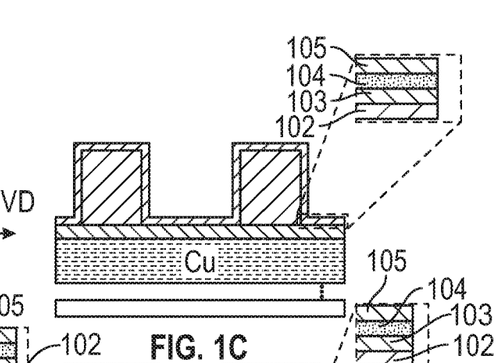

FIG. 1(C) includes forming second 102, third 103, fourth 104, and fifth 105 layers on pillars 113, 114. In FIG. 1(C) these four layers are depicted as a single thin layer for clarity purposes but, at a more detailed level, include the four layers in an embodiment. Layers 102, 103, 104, 105 may be quite thin compared to layers such as layer 101. In an embodiment the second layer 102 is less than 10 nm thick (however in other embodiments the layer is between 1 and 5, 15, 20, or 25 nm), thickness being defined vertically; the third layer 103 is less than 20 nm thick (however in other embodiments the layer is between 1 and 5, 15, 25, 30, or 50 nm); the fourth layer 104 is less than 100 nm thick (however in other embodiments the layer is between 1 and 50, 75, 125, or 150 nm); and the fifth layer 105 is less than 20 nm thick (however in other embodiments the layer is between 1 and 5, 15, 25, 30, or 50 nm). These layers may be formed via any of several formation techniques, such as Metalorganic Chemical Vapor Deposition (MOCVD), PVD, or ALD.

Layers 103, 104, 105 may collectively form a capacitor. More specifically, the capacitor may include an electrode that includes the third layer 103 and an additional electrode that includes the fifth layer 105. The third and/or fifth layers may include, for example, $SrRuO_3$, Ru, Pt, $LaSrMnO_3$, or combinations thereof.

The fourth layer 104 may include a Perovskite material such as, without limitation, BFO (e.g., $BiFeO_3$), LFO (e.g., $LuFeO_2$, $LuFe_2O_4$), La doped $BiFeO_3$, $BiTiO_3$, PZT (lead zirconate titanate $(Pb[Zr(x)Ti(1-x)]O_3)$), PMN-PT $(Pb(Mg_{1/3}Nb_{2/3})O_3$—$PbTiO_3)$ or combinations thereof. In some embodiments, the material of layer 104 includes at least one of: Bi, Fe, O, Lu, La, Ti, Pb, Ti or combinations thereof. As used herein, Perovskites have a cubic structure with a general formula of $ABO_3$, where 'A' includes one of an alkaline earth or rare earth element (e.g., Sr, Bi, Ba, etc.) while 'B' is one of a 3d, 4d, or 5d transition metal element (e.g., Ti, Fe, etc.).

Thus, the capacitor (which includes layers 103, 104, 105) is formed on layer 102. Layer 102 may act as a template layer (also known as a "seed layer") that helps to promote proper growth of layer 104 on the non-amorphous pillars 113, 114. Layer 102 may include, for example, $SrTiO_3$, Nb doped $SrTiO_3$, or combinations thereof. In an embodiment, the second layer 102 directly contacts the first and second sidewalls 115, 116 and the first surface 117 but not a majority of the second surface 118. In an embodiment, the fourth layer 104 directly contacts the third 103 and fifth 105 layers.

Figure 1D:
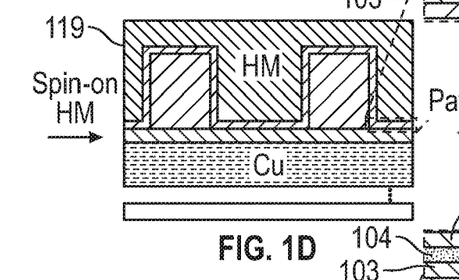
Figure 1E:
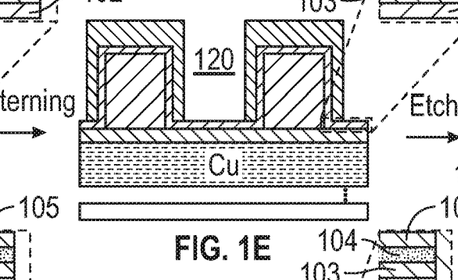
Figure 1F:
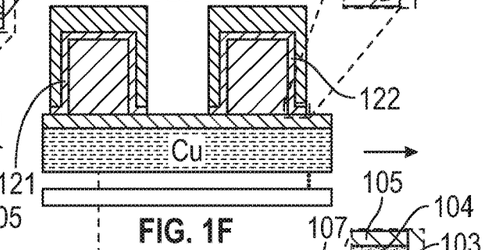
Figure 1G:
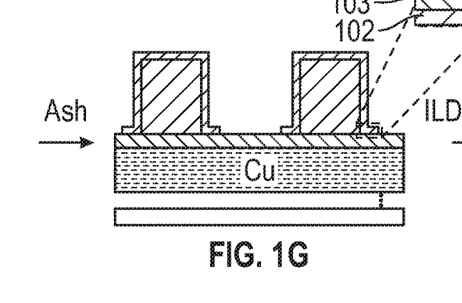
Figure 1H:
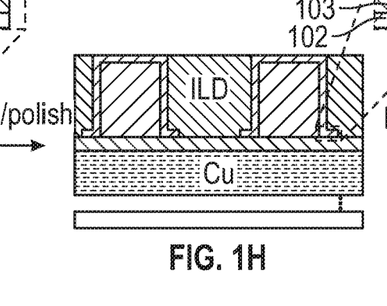

FIG. 1(D) illustrates forming a hard mask 119 (e.g., spin-on hard mask or CVD hard mask) over the fifth layer 105. The hard mask is patterned (e.g., dry etching) in FIG. 1(E) to form a void or access area 120 which is then used to remove portions of layers 102, 103, 104, 105 in FIG. 1(F). This prevents electrical shorting between what are now two separate capacitors 121, 122. Ashing occurs in FIG. 1(G) to remove the hard mask. This is followed by interlayer dielectric (ILD) formation in FIG. 1(H). Afterwards, in FIG. 1(I) a sixth layer 106 is formed as the back end formation continues. For example, layer 106 may be an additional metal layer including the same metal as metal layer 101. Like layer 101, layer 106 may include a diffusion barrier layer 107 (e.g., TaN).

Figure 1I:
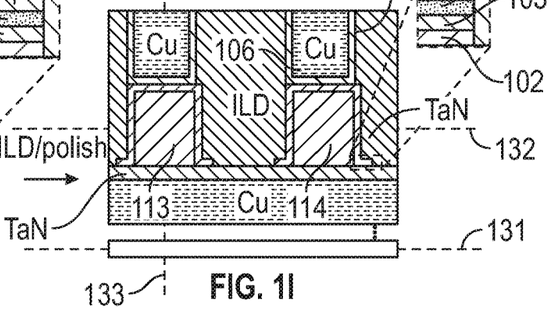

In FIG. 1(I) a first plane 131 intersects the substrate 110 but none of the first, second, third, fourth, fifth, or sixth layers. A second plane 132 intersects the first sidewall 115, the second sidewall 116, and the second 102, third 103, fourth 104, and fifth 105 layers. The first plane 131 is parallel to the second plane 132. A third plane 133 is orthogonal to the first plane 131. The third plane 133 intersects the first and second surfaces 117, 118 but does not intersect the first or second sidewalls 115, 116. The third plane intersects the first 101, second 102, third 103, fourth 104, fifth 105, and sixth layers 106. To intersect the build-up metal layers, such as layers 101, 106, the plane 133 need not necessarily intersect the metal (e.g., copper) in the layer considering the buildup metal layer includes both metal portions and non-metal portions (i.e., to form traces and the like some metal may be removed or not formed).

As a result, the capacitor (layers 103, 104, 105) on pillar 113 avoids many of the issues found with back end capacitors formed in high-aspect ratio trenches. For instance, a trench may have ILD-based sidewalls and a floor comprised of a diffusion barrier. The ILD sidewalls (e.g., $SiO_2$) and diffusion-barrier (e.g., TaN) provide different materials that complicate the formation of uniform back end capacitor layers. Further, the amorphous materials also complicate the formation of uniform back end capacitor layers (e.g., a uniform seed layer). However, the use of pillars provides a non-amorphous surface (which is not a trench and therefore avoids seems and other issues that correspond to high aspect ratio trenches) upon which layers 102, 103, 104, 105 may be uniformly formed using techniques such as MOCVD and/or PVD and/or ALD.

FIG. 1(I) may provide for two capacitors that may function in a memory cell having two or more capacitors or in two different memory cells, such as two 1T-1C memory cells. Thus, in FIG. 1(I) a first capacitor may be comprised of layers 103, 104, 105 on pillar 113 and another capacitor may be comprised of layers 103, 104, 105 on pillar 114. Each capacitor may be formed on layer 102. Each capacitor is between metal layers 101, 106. The second plane 132 intersects additional first and second sidewalls of pillar 114 as well at the layers 102, 103, 104, 105 that are on pillar 114.

As mentioned above, use of Perovskite materials within back end memories may reduce the size needed for such memory cells. This may in turn provide more back end space for peripheral circuits, such as peripheral logic circuits that control back end memory cells.

Such peripheral circuitry may include a multiplexor (MUX). A MUX is a device that selects, for example, one of several input signals and forwards the selected input signal. Multiplexers are mainly used to increase the amount of data that can be sent over the network within a certain amount of time and bandwidth. A multiplexer may also be called a data selector. For memory control circuitry, a MUX may be used as a form of addressing circuit used to address memory cells. Addressing circuits include X decoders, Y decoders, word line drivers, bit line drivers, and the like. Other forms of peripheral circuitry for memory include, for example, sense amplifiers, pre-charge circuits, and the like.

Such peripheral circuits may make up nearly 30% of the memory area for a single array. If these peripheral circuits are formed in the front end, extra area on the silicon wafer (the front end) must be used for the peripheral circuits. This may increase the overall size of the memory system. However, embodiments address this issue by locating one or more portions of memory control circuitry in the back end. Such embodiments may include back end transistors. These back end transistors may be used not only in the memory control circuits (e.g., MUX) but also in the back end memory cells. Such cells include, for example, 1T-1C cells that include one back end transistor and one back end capacitor. Such capacitors may include ferroelectric materials in some embodiments or ferroelectric Perovskite materials in some embodiments. As a result, the capacitors provide stable data storage, which in turn provides relaxed design space. For example, the restraints of arranging memory cells with respect to one another are relaxed because data loss due to interference between cells (and the word lines that help operate the cells) is less likely to occur with ferroelectric-based memory.

Ferroelectric memory refers to a memory technology employing ferroelectric materials. A ferroelectric material is a material that exhibits, over some range of temperatures, a spontaneous electric polarization (i.e., displacement of positive and negative charges from their original position), that can be reversed or reoriented by application of an electric field. Because the displacement of the charges in ferroelectric materials can be maintained for some time even in the absence of an electric field, such materials may be used to implement memory cells. A ferroelectric material may include anti-ferroelectric materials as well.

Embodiments using ferroelectric memories provide adequate non-volatility, short programming time, low power consumption, high endurance, and high speed writing. In addition, such embodiments may be manufactured using processes compatible with the standard complementary metal-oxide-semiconductor (CMOS) technology.

A ferroelectric memory system disclosed herein includes 1T-1C memory cell. An access transistor of the cell may include a back end transistor that is coupled to the capacitor by sharing its source/drain terminal with one electrode of the capacitor and is used for both READ and WRITE access to the capacitor.

While many embodiments address locating some portion of peripheral memory circuitry in the back end, other portions of the peripheral memory circuitry may be located in the front end. Such front end circuitry (e.g., sense amplifier) may be located below the memory array and/or back end memory control circuitry (e.g., MUX) to reduce the overall size of the wafer substrate used for the front end and/or allow the front end area typically used for memory peripheral circuitry to be used for other purposes (e.g., a processor). Many vias are used to interconnect front end devices (e.g., transistors in a sense amplifier) to back end devices (e.g., memory cells and/or MUX).

Thus, embodiments described herein provide advantages by locating peripheral circuitry (that would otherwise be in the front end) in the backend. By doing so this reduces the need to route word lines and/or bit lines from the back end to the front end. This reduction in routing reduces the layout complexity for interconnect structures within the back end. Improvements are not limited to reduction of front end space and alleviating routing complexity of word lines and bit lines. Advantages also include, for example, the use of NMOS-only backend transistors and contact structures for the back end control circuits and memory cells. For example, transistors for the MUX and the memory cell access transistor may be located within the same interconnect level of the back end and may both be NMOS (thereby reducing the manufacturing steps needed to produce CMOS circuitry within a single interconnect layer). The NMOS back end circuits can be made simultaneously with the transistor of the 1T-1C without incurring extra cost (e.g., few or no additional masks and few or no additional process steps). In another example, transistors for the MUX and the memory cell access transistor may be located within the same interconnect level of the back end and may both be PMOS (thereby reducing the manufacturing steps needed to produce CMOS circuitry within a single interconnect layer).

Figure 2:
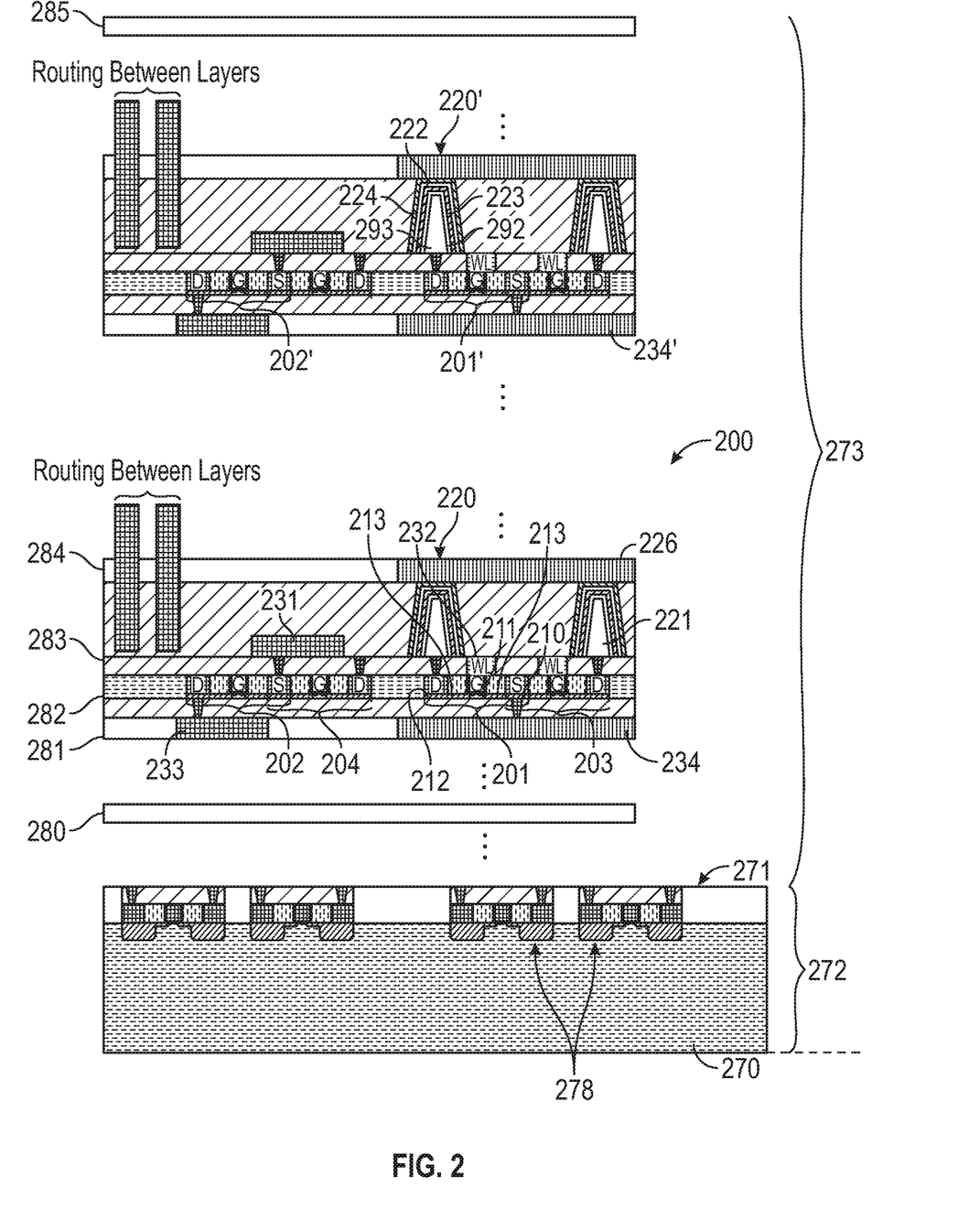
FIG. 2 includes a memory system in an embodiment.

FIG. 2 includes a memory system 200 in an embodiment. System 200 comprises a substrate 270 having a surface 271. Substrate 270 may constitute a front end 272 located below a back end 273 that includes layers. Such layers may also be referred to as "metal layers" or "interconnect layers" in some embodiments or, more generally, layers. Backend layers include, for example, layers 280, 281, 282, 283, 284, 285. Front end 272 may include transistors 278 or, in other embodiments, may omit transistors and provide more of a supporting role such as a package substrate.

A first layer 281 (or layer 280 in other embodiments) includes a metal, the first layer 281 being on the substrate 270. A second layer 285 includes the same metal as layer 281. The second layer 285 is on the first layer 281. A first switching device 201 is between the first and second layers 281, 285. The first switching device 201 comprises a first source region 210 (where first source region 210 is directly below the source contact that is labeled "S"), a first channel region 211 (where channel region 211 is directly below the gate labeled "G" and gate dielectric layer that is not labeled for sake of clarity), and a first drain region 212 (where first drain region 212 is directly below drain contact that is labeled "D"). Switching device 201 may be a thin film transistor (TFT) that includes areas of doping 213 that differ from the doping of regions 210, 212. However, embodiments are not limited to TFTs. For instance, other embodiments may use transistors based on a change in material composition under the source and drain form an n-un-doped-n structure.

A TFT may include a field effect transistor implemented using thin film technology. The thin films may include, for example, films of polycrystalline or amorphous silicon, transition metal dichalcogenide (TMD) monolayers, compound semiconductors (e.g., cadmium selenide), metal oxides (e.g., zinc oxide, hafnium oxide), and a variety of insulating substrates. More specifically, a TFT may include a special kind of metal-oxide-semiconductor field effect transistor (MOSFET) made by depositing thin films of an active semiconductor layer as well as metallic contacts over a supporting substrate. TFTs differ from conventional MOSFETs because the semiconductor material (and channel) of conventional MOSFETs is typically the substrate, such as a silicon wafer (instead of a thin film as is the case with a TFT). While TFTs 201, 202, 203, 204 are shown with a specific architecture (e.g., gate, source, and drain contacts all on the semiconductor materials) other TFT architectures (e.g., where gate and source/drain contacts are on opposite sides of semiconductor layer and/or where gate and drain/source contacts are on opposite sides of semiconductor layer) may be used while still providing for an embodiment where stacked memory (e.g., DRAM, MRAM, RRAM) has a portion of its peripheral circuitry (e.g., MUX) located in the back end layers.

System 200 may include other switching devices such as TFTs 202, 203, 204. Switching device 202, for example, is between the first and second layers 281, 285 and includes a second source region, a second channel region, and a second drain region similar to device s01.

Capacitor 220 is between layers 281, 285. Capacitors 220, 221, 220' may be ferroelectric Perovskite capacitors and include Perovskite materials. Capacitor 220' is a representative ferroelectric Perovskite capacitor. Perovskite materials 222 may be between metal or conductor layer 223 and metal or conductor layer 224 and on seed layer 292 and non-amorphous island 293. Capacitor 220 may couple to a common plate or interconnect 226. Interconnect 226 is coupled to capacitor 221.

A first memory cell includes the switching device 201 and the capacitor 220. The cell constitutes a 1T-1C memory cell. Another memory cell includes switching device 203 and capacitor 221. Switching device 202 is not included in any memory cell and is instead included in a peripheral circuit such as a MUX or sense amplifier.

An interconnect line may couple the first and second switching devices 201, 202 to each other. For example, an interconnect line 231 may couple device 202 to interconnect line 232 and interconnect line 232 may couple to device 201. For example, an interconnect line 233 may couple device 202 to an interconnect line 234 and line 234 may couple to device 201.

Devices 201, 202 are in the same backend layer and may be formed simultaneously thereby providing manufacturing efficiency in terms of cost, time, and complexity.

In system 200 interconnect line 232 is between the switching device 201 and the layer 285. Thus, in such an embodiment device 202 may include interconnect lines above and below the device, where the lines may couple to word lines, bit lines, and the like. This illustrates an advantage for locating peripheral circuit device 202 in the back end. Specifically, by locating the device 202 in the back end interconnects to the device can be both above and below the device whereas the interconnects would only be above the device if the device were in the frontend.

An embodiment comprises a sense amplifier corresponding to the memory cell (that includes device 201 and capacitor 220) where the sense amplifier includes the second switching device 202. By "corresponding to" the sense amplifier is configured to sense the data of the memory cell (that includes device 201 and capacitor 220) when that cell is properly selected by control circuitry.

However, in another embodiment system 200 includes a MUX that includes the second switching device 202. The MUX is to select one of the first switching device 201 or another switching device (e.g., device 203) when such a device (and corresponding cell) is properly selected.

System 200 may include additional switching devices in layers between layer 282 and layer 285 or within layer 285 or some other backend layer. For example, layer 285 and adjacent layers may be arranged like layers 282, 283, 284 to provide a stacked layer of memory cells and control circuitry (e.g., MUX) similar to layers 282, 283, 284. Such an additional layer of memory cells may be addressed by a mux including device 202 or some other mux located in system 200, such as within the same back end layer as the access transistor of the additional memory cell. As a brief example whose description is abbreviated for clarity, additional stacks of memory may include a memory cell with capacitor 220' and switching device 201', a MUX may utilize switching device 202', and an interconnect line 234' may couple to device 201'.

In an embodiment the switching devices 201, 202 are both NMOS transistors and layer 282 does not include a PMOS transistor. As a result, manufacturing is simplified by avoiding CMOS procedures. In an embodiment the switching devices 201, 202 are both PMOS transistors and layer 282 does not include an NMOS transistor. As a result, manufacturing is simplified by avoiding CMOS procedures. Further, the transistors 201, 202 may be the same type of transistor. For example, not only are transistors 201, 202 NMOS, but they may also include the same gate dielectric material and the same channel semiconductor material.

While 1T-1C memory cells are shown in FIG. 2, in other embodiments memory cells are not limited in that way and the memory cells may include a component in addition to the one transistor and one capacitor. The "additional component" may include at least one of an additional capacitor or an additional switching device such that embodiments include memory cells that are not 1T-1C but may have multiple transistors, capacitors, and/or transistors and capacitors.

Figure 3:
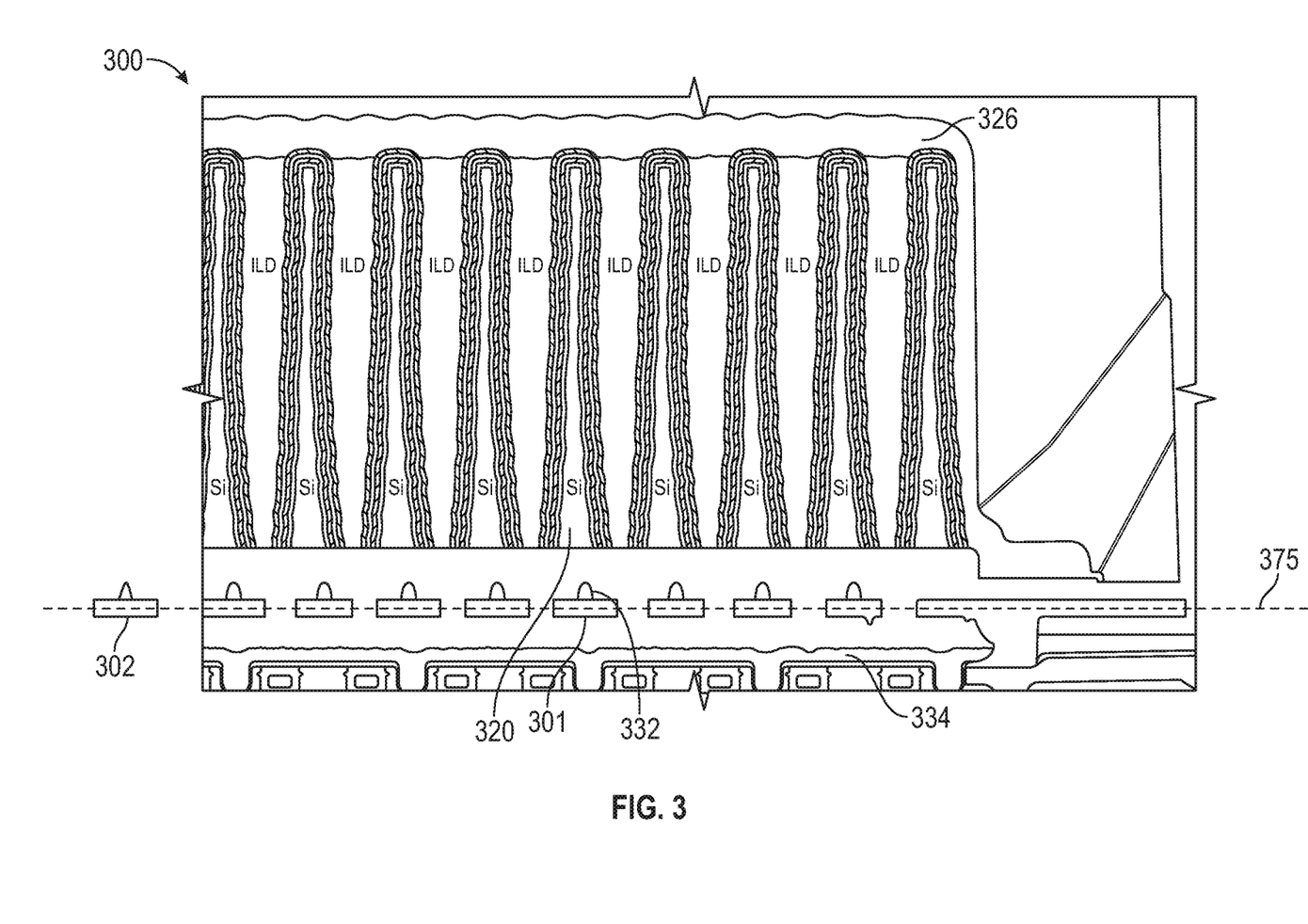
FIG. 3 includes an abstracted representation of an image of memory system in an embodiment.

FIG. 3 includes an abstracted representation of an image of a memory system in an embodiment. Similar to FIG. 2, FIG. 3 includes a memory system 300 that includes a memory cell including capacitor 320 and switching device 301. Word line 332 couples to the gate of the device 301. Interconnect line 334 (in some embodiments) is between the substrate (not shown) and device 301. Capacitor 320 couples to a common interconnect 326. Another switching device 302 is included at the same level as device 301. In other words, plane 375 intersects devices 301, 302. Device 302 may be included in peripheral circuitry, such as a MUX, that is coupled to the memory cell that includes device 301.

Figure 4:
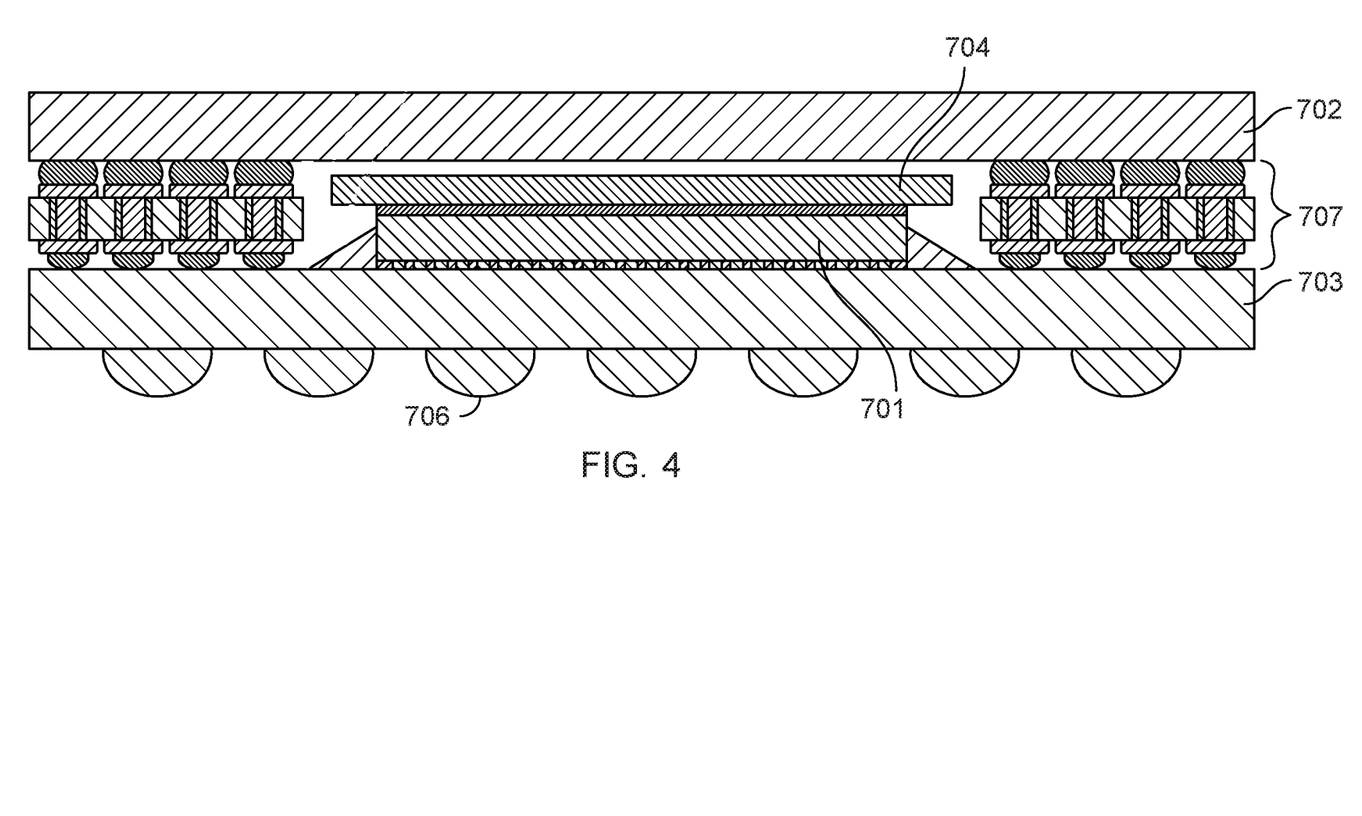
FIGS. 4, 5, 6, 7 include systems that include embodiments.

FIG. 4 includes a package system in an embodiment. The system includes a processor die 701 (a first package) on a package substrate 703. A memory die (a second package) 702 couples to the substrate 703 by way of interposer system 707. Underfill material exists between die 701 and substrate 703. Substrate 703 may include controlled collapse chip connection (C4) interconnects 706. Further, to prevent warping of die 701, die 701 may couple to a metal stiffener 704. Die 701 may include a die stack (e.g., multiple dies which may have the same function or differing functions) that may be molded as one unit that functions as a single die. For example, one die of the stack may have a first logic function while another die of the stack has another logic function that differs from the first logic function.

In the embodiment of FIG. 4, die 701 includes the memory of any of FIGS. 1(A)-3. In another embodiment die 702 includes the memory of any of FIGS. 1(A)-3. In an embodiment die 701 includes the memory of any of FIGS. 1(A)-3 and die 702 includes the memory of any of FIGS. 1(A)-3.

In an embodiment element 704 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Thus, FIG. 4 depicts an integrated circuit, a memory, and a package housing that includes the integrated circuit and the memory. The integrated circuit and/or memory includes the memory of any of FIGS. 1(A)-3. For example, the circuit may be a processor with embedded DRAM (and/or MRAM and/or RRAM and the like) that includes the memory of any of FIGS. 1(A)-3. For example, the circuit may be a field programmable gate array (FPGA) with memory located in the back end or front end of the FPGA. In other embodiments, the memory (in addition to the integrated circuit or instead of the integrated circuit) includes any of the memory of FIGS. 1(A)-3.

Figure 5:
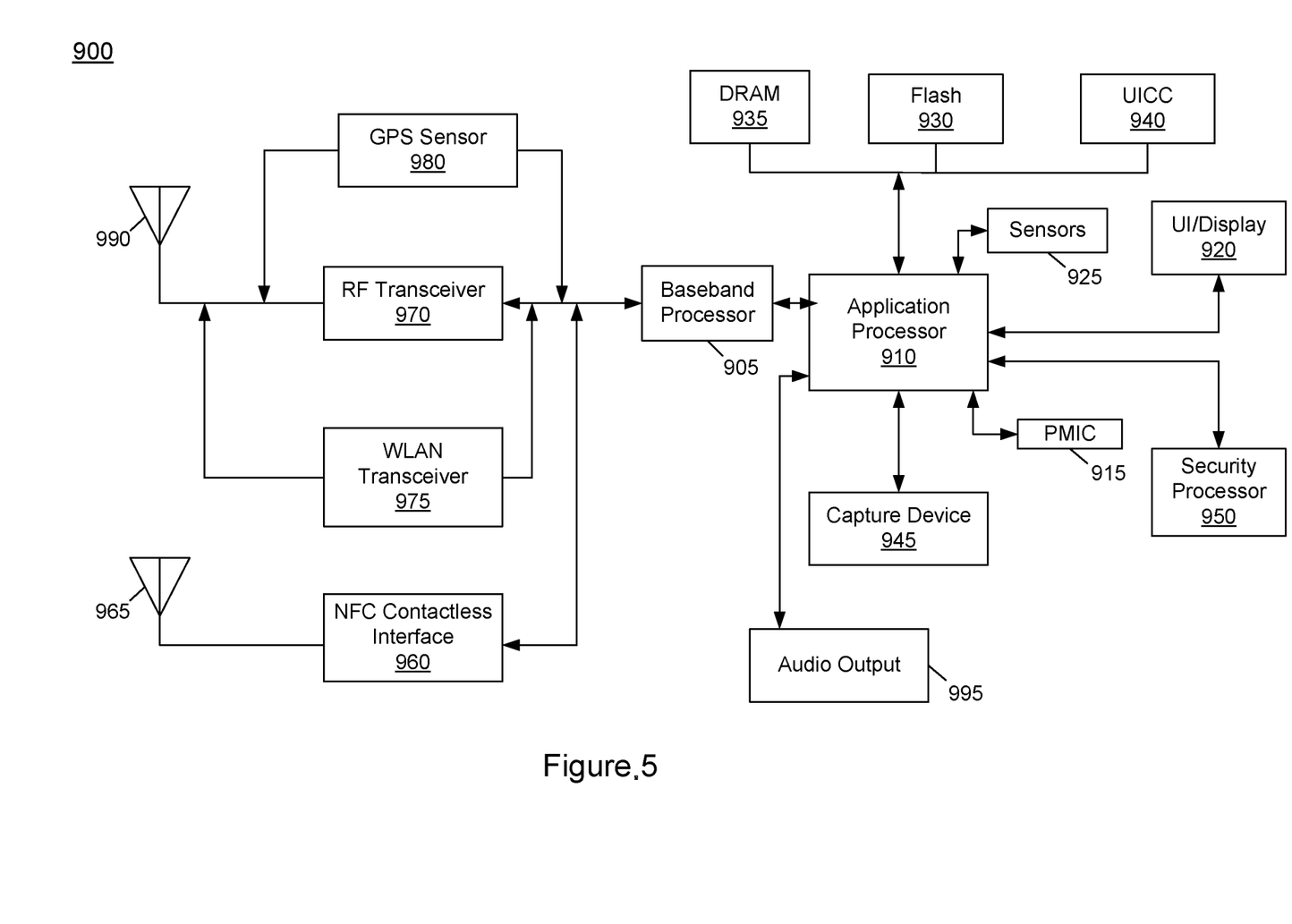

Referring now to FIG. 5, shown is a block diagram of an example system with which embodiments can be used. As seen, system 900 may be a smartphone or other wireless communicator or any other Internet of Things (IoT) device. A baseband processor 905 (which may include any memory described herein) is configured to perform various signal processing with regard to communication signals to be transmitted from or received by the system. In turn, baseband processor 905 is coupled to an application processor 910, which may be a main CPU (which may include any memory described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory (which may include any memory described herein), namely a flash memory 930 and a system memory, namely a DRAM 935. As further seen, application processor 910 also couples to audio output 995 and a capture device 945 such as one or more image capture devices that can record video and/or still images.

A universal integrated circuit card (UICC) 940 (which may include any memory described herein) comprises a subscriber identity module, which in some embodiments includes a secure storage to store secure user information. System 900 may further include a security processor 950 (e.g., Trusted Platform Module (TPM)) (which may include any memory described herein) that may couple to application processor 910. A plurality of sensors 925, including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include any memory described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 6:
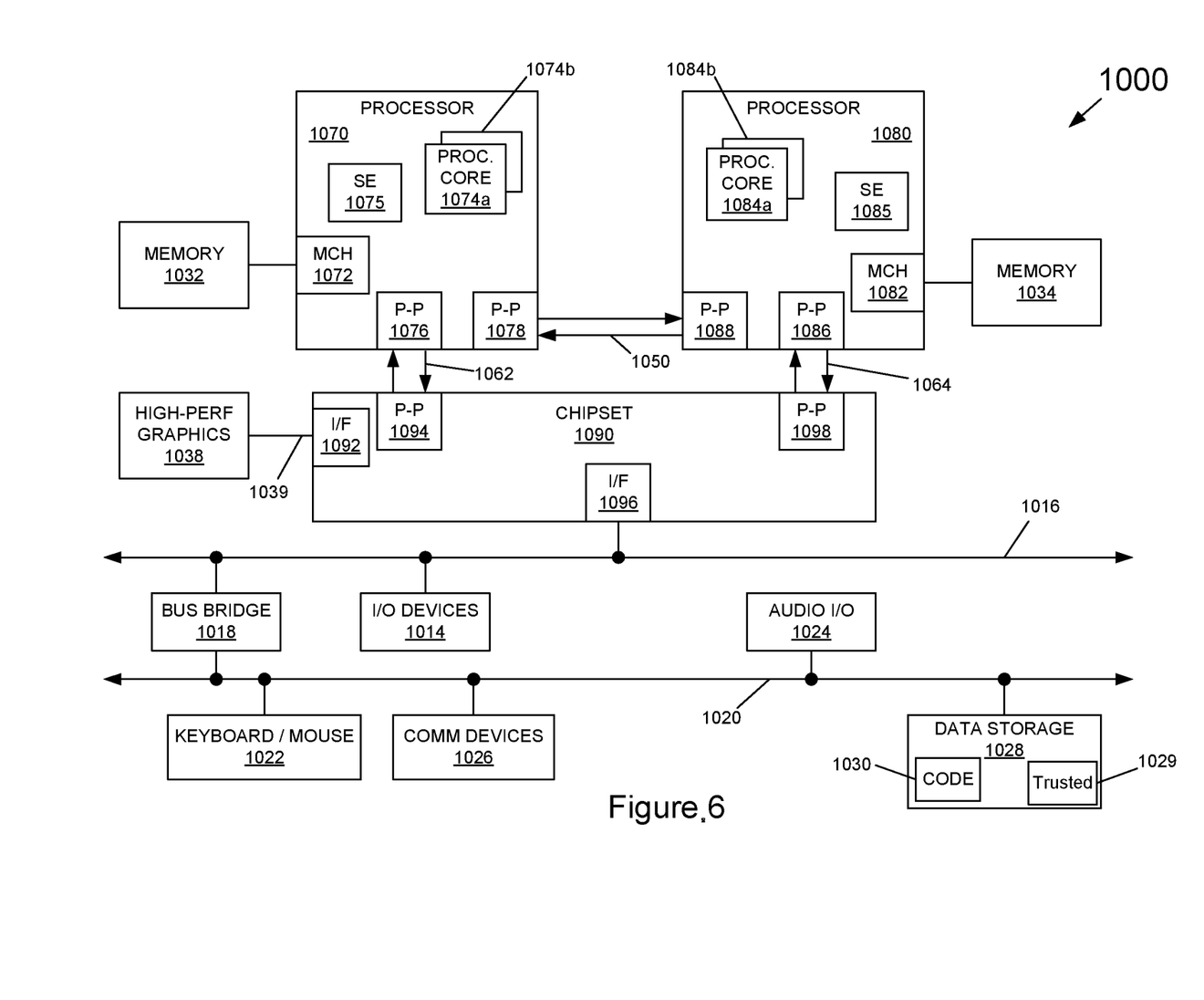

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include any memory described herein) such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034 (which may include any memory described herein), which may be portions of main memory (e.g., a DRAM) locally attached to the respective processors. First processor 1070 and second processor 1080 may be coupled to a chipset 1090 (which may include any memory described herein) via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include any memory described herein) such as a non-volatile storage or other mass storage device. As seen, data storage unit 1028 (which may include any memory described herein) may include code 1030, in one embodiment. As further seen, data storage unit 1028 also includes a trusted storage 1029 to store sensitive information to be protected. Further, an audio I/O 1024 may be coupled to second bus 1020.

Figure 7:
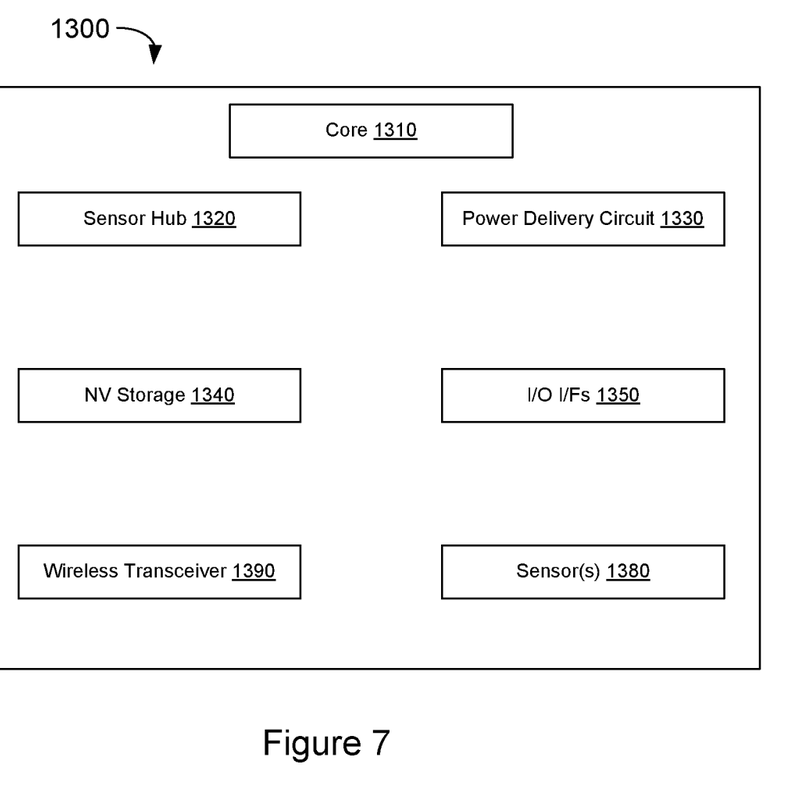

Referring now to FIG. 7, embodiments may be used in environments where IoT devices may include wearable devices or other small form factor IoT devices. Shown is a block diagram of a wearable module 1300 in accordance with another embodiment. In one particular implementation, module 1300 (which may include any memory described herein) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320, which may be configured to interact with a plurality of sensors 1380, such as one or more biometric, motion environmental or other sensors. A power delivery circuit 1330 (which may include any memory described herein) is present, along with a non-volatile storage 1340 (which may include any memory described herein). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1

A system comprising: a substrate; first, second, third, fourth, fifth, and sixth layers, (a) the first layer being between the substrate and the sixth layer, and (b) the fourth layer being between the third and fifth layers; a pillar between the first and second layers, the pillar including: (a) a material that is non-amorphous; and (b) first and second sidewalls that oppose one another; a capacitor between the second and sixth layers, the capacitor including: (a) the third, fourth, and fifth layers, and (b) an electrode that includes the third layer and an additional electrode that includes the fifth layer; and a switching device between the first and sixth layers; wherein: (a) the first layer includes a metal and the sixth layer includes the metal, and (b) the fourth layer includes at least one of Bismuth, Iron, Lutetium, Titanium, Lead, Zirconium, or combinations thereof or combinations thereof.

Example 2

The system of example 1 comprising a memory cell, the memory cell including the capacitor and the switching device.

Example 3

The system of example 2 wherein the second layer includes at least one of Strontium, Titanium, Niobium, or combinations thereof.

Example 4

The system of example 3 wherein: the pillar includes first and second opposing surfaces; the first surface couples the first and second sidewalls to one another; the second surface couples the first and second sidewalls to one another.

Example 5

The system of example 4 wherein: the second layer directly contacts the first and second sidewalls; the second layer directly contacts the first surface.

Example 6

The system of example 5 wherein: a first plane intersects the substrate but none of the first, second, third, fourth, fifth, or sixth layers; a second plane intersects the first sidewall, the second sidewall, and the second, third, fourth, and fifth layers; and the first plane is parallel to the second plane.

Example 7

The system of example 6 comprising a third plane, wherein: the third plane is orthogonal to the first plane; the third plane intersects the first and second surfaces; the third plane does not intersect the first sidewall; the third plane does not intersect the second sidewall.

Example 8

The system of example 7 wherein the third plane intersects the first, second, third, fourth, fifth, and sixth layers.

Example 9

The system of example 8 wherein the fourth layer directly contacts the third and fifth layers.

Another version of Example 9. The system of example 8 wherein: the fourth layer directly contacts the third and fifth layers; and the second layer directly contacts the third layer.

Example 10

The system of example 6 wherein: the second layer is less than 10 nm thick, thickness being defined in a direction orthogonal to the first plane; the third layer is less than 20 nm thick; the fourth layer is less than 100 nm thick; and the fifth layer is less than 20 nm thick.

Example 11

The system of example 6 comprising: additional first, additional second, additional third, additional fourth, additional fifth, and additional sixth layers, (a) the additional first layer being between the substrate and the additional sixth layer, and (b) the additional fourth layer being between the additional third and additional fifth layers; an additional pillar between the additional first and additional second layers, the additional pillar including: (a) an additional material that is non-amorphous; and (b) additional first and additional second sidewalls that oppose one another; an additional capacitor between the additional second and additional sixth layers, the additional capacitor including: (a) the additional third, additional fourth, and additional fifth layers, and (b) another electrode that includes the additional third layer and a supplemental electrode that includes the additional fifth layer; and an additional switching device between the additional first and additional sixth layers; wherein: (a) the additional first layer includes the metal and the additional sixth layer includes the metal, (b) the additional fourth layer includes at least one of Bismuth, Iron, Lutetium, Titanium, Lead, Zirconium, or combinations thereof, and (c) the second plane intersects the additional first sidewall, the additional second sidewall, and the additional second, additional third, additional fourth, and additional fifth layers.

Example 12

The system of example 2 wherein the switching device comprises a source region, a channel region, and a drain region.

Example 13

The system of example 2 comprising a bit line, wherein the switching device couples the capacitor to the bit line.

Example 14

The system of example 13 wherein the bit line is between the capacitor and the first layer.

Another version of example 14. The system of example 13 wherein: the bit line is between the capacitor and the first layer; the bit line includes the pillar.

Example 15

The system of example 14 comprising: an additional switching device between the substrate and sixth layers; an interconnect line that couples the switching device and the additional switching device to each other; and the additional switching device is not included in any memory cell.

Example 16

The system of example 15 wherein the additional switching device is included in at least one of a sense amplifier or a multiplexor (MUX).

Example 17

The system of example 15 wherein: the switching device is an NMOS transistor; the additional switching device is an additional NMOS transistor; the switching device and the additional switching device are included in a layer; and the layer does not include a PMOS transistor.

Example 18

The system of example 2 wherein: a majority of the material of the pillar is non-amorphous; the material of the pillar includes silicon; the metal includes at least one of copper, aluminum, cobalt, tungsten, or combinations thereof.

Example 19

The system of example 2 comprising: an integrated circuit on a first die; a memory on a second die, the memory comprising the memory cell; the first die and the second die both on a package substrate.

Example 20

The system of example 19 wherein the integrated circuit comprises a field programmable gate array (FPGA).

Example 21

The system of example 19 comprising: a radiofrequency receiver; and a chassis; wherein the chassis includes the radiofrequency receiver and the package substrate.

Another version of Example 21: The system of example 1 wherein a majority of the capacitor is not included in a trench.

Example 22

A method comprising: providing a substrate; forming a first layer on the substrate; forming a pillar on the first layer, the pillar including: (a) a material that is non-amorphous; and (b) first and second sidewalls that oppose one another; forming second layer on the pillar; forming a capacitor on the second layer, the capacitor including: (a) third, fourth, and fifth layers with the fourth layer between the third and fifth layers; (b) an electrode that includes the third layer and an additional electrode that includes the fifth layer; and forming a switching device and a sixth layer with the switching device being between the first and sixth layers; wherein: (a) the first layer includes a metal and the sixth layer includes the metal, and (b) the fourth layer includes at least one of Bismuth, Iron, Lutetium, Titanium, Lead, Zirconium, or combinations thereof.

Example 23

The method of example 22 comprising forming a memory cell, the memory cell including the capacitor and the switching device.

Example 24

A system comprising: first, second, third, fourth, fifth, and sixth layers, (a) the second, third, fourth, and fifth layers being between the first and sixth layers, and (b) the fourth layer being between the third and fifth layers; a formation between the first and second layers, the formation including: (a) a material that is non-amorphous; and (b) first and second sidewalls; a capacitor between the second and sixth layers, the capacitor including: (a) the third, fourth, and fifth layers, and (b) an electrode that includes the third layer and an additional electrode that includes the fifth layer; and a switching device between the first and sixth layers; wherein: (a) the first layer includes a metal and the sixth layer includes the metal, and (b) the fourth layer includes a Perovskite material.

Example 25

The system of example 24 comprising a memory cell, the memory cell including the capacitor and the switching device.

Example 1a

A system comprising: a substrate; first, second, third, fourth, fifth, and sixth layers, (a) the first layer being between the substrate and the sixth layer, and (b) the fourth layer being between the third and fifth layers; a pillar between the first and second layers, the pillar including: (a) a material that is non-amorphous; and (b) first and second sidewalls that oppose one another; a capacitor between the second and sixth layers, the capacitor including: (a) the third, fourth, and fifth layers, and (b) an electrode that includes the third layer and an additional electrode that includes the fifth layer; and a switching device between the first and sixth layers; wherein: (a) the first layer includes a metal and the sixth layer includes the metal, and (b) the fourth layer includes at least one of Bismuth, Iron, Lutetium, Titanium, Lead, Zirconium, or combinations thereof.

Example 2a

The system of example 1a comprising a memory cell, the memory cell including the capacitor and the switching device.

Example 3a

The system according to any of examples 1a-2a wherein the second layer includes at least one of Strontium, Titanium, Niobium, or combinations thereof.

Example 4a

The system according to any of examples 1a-3a wherein: the pillar includes first and second opposing surfaces; the first surface couples the first and second sidewalls to one another; the second surface couples the first and second sidewalls to one another.

Example 5a

The system of example 4a wherein: the second layer directly contacts the first and second sidewalls; the second layer directly contacts the first surface.

Example 6a

The system according to any of examples 1a-5a wherein: a first plane intersects the substrate but none of the first, second, third, fourth, fifth, or sixth layers; a second plane intersects the first sidewall, the second sidewall, and the second, third, fourth, and fifth layers; and the first plane is parallel to the second plane.

Example 7a

The system according to any of examples 4a-6a comprising a third plane, wherein: the third plane is orthogonal to the first plane; the third plane intersects the first and second surfaces; the third plane does not intersect the first sidewall; the third plane does not intersect the second sidewall.

Example 8a

The system of example 7a wherein the third plane intersects the first, second, third, fourth, fifth, and sixth layers.

Example 9a

The system according to any of examples 1a-8a wherein the fourth layer directly contacts the third and fifth layers.
Another version of Example 9a. The according to any of examples 1a-8a wherein: the fourth layer directly contacts the third and fifth layers; and the second layer directly contacts the third layer.

Example 10a

The system according to any of examples 1a-9a wherein: the second layer is less than 10 nm thick, thickness being defined in a direction orthogonal to the first plane; the third layer is less than 20 nm thick; the fourth layer is less than 100 nm thick; and the fifth layer is less than 20 nm thick.

Example 11a

The system according to any of examples 1a-10a comprising: additional first, additional second, additional third, additional fourth, additional fifth, and additional sixth layers, (a) the additional first layer being between the substrate and the additional sixth layer, and (b) the additional fourth layer being between the additional third and additional fifth layers; an additional pillar between the additional first and additional second layers, the additional pillar including: (a) an additional material that is non-amorphous; and (b) additional first and additional second sidewalls that oppose one another; an additional capacitor between the additional second and additional sixth layers, the additional capacitor including: (a) the additional third, additional fourth, and additional fifth layers, and (b) another electrode that includes the additional third layer and a supplemental electrode that includes the additional fifth layer; and an additional switching device between the additional first and additional sixth layers; wherein: (a) the additional first layer includes the metal and the additional sixth layer includes the metal, (b) the additional fourth layer includes at least one of Bismuth, Iron, Lutetium, Titanium, Lead, Zirconium, or combinations thereof, and (c) the second plane intersects the additional first sidewall, the additional second sidewall, and the additional second, additional third, additional fourth, and additional fifth layers.

Example 12a

The system according to any of examples 1a-11a wherein the switching device comprises a source region, a channel region, and a drain region.

Example 13a

The system according to any of examples 1a-12a comprising a bit line, wherein the switching device couples the capacitor to the bit line.

Example 14a

The system of example 13a wherein the bit line is between the capacitor and the first layer.
Another version of example 14a. The system of example 13a wherein: the bit line is between the capacitor and the first layer; the bit line includes the pillar.

Example 15a

The system according to any of examples 1a-14a comprising: an additional switching device between the substrate and sixth layers; an interconnect line that couples the switching device and the additional switching device to each other; and the additional switching device is not included in any memory cell.

Example 16a

The system of example 15a wherein the additional switching device is included in at least one of a sense amplifier or a multiplexor (MUX).

Example 17a

The system according to any of examples 15a-16a wherein: the switching device is an NMOS transistor; the additional switching device is an additional NMOS transistor; the switching device and the additional switching device are included in a layer; and the layer does not include a PMOS transistor.

Example 18a

The system according to any of examples 1a-17a wherein: a majority of the material of the pillar is non-amorphous; the material of the pillar includes silicon; the metal includes at least one of copper, aluminum, cobalt, tungsten, or combinations thereof.

Example 19a

The system according to any of examples 1a-18a comprising: an integrated circuit on a first die; a memory on a second die, the memory comprising the memory cell; the first die and the second die both on a package substrate.

Example 20a

The system of example 19 wherein the integrated circuit comprises a field programmable gate array (FPGA).

Example 21a

The system according to any of examples 19a-20a comprising: a radiofrequency receiver; and a chassis; wherein the chassis includes the radiofrequency receiver and the package substrate.
Another version of Example 21a. The system according to any of examples 1a-20a wherein a majority of the capacitor is not included in a trench.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:
1. A system comprising:
 a substrate;
 first, second, third, fourth, fifth, and sixth layers, (a) the first layer being between the substrate and the sixth layer, and (b) the fourth layer being between the third and fifth layers;
 a pillar between the first and second layers, the pillar including: (a) a material that is non-amorphous; and (b) first and second sidewalls that oppose one another;
 a capacitor between the second and sixth layers, the capacitor including: (a) the third, fourth, and fifth layers, and (b) an electrode that includes the third layer and an additional electrode that includes the fifth layer; and
 a switching device between the first and sixth layers;
 wherein: (a) the first layer includes a metal and the sixth layer includes the metal, and (b) the fourth layer includes at least one of Bismuth, Iron, Lutetium, Titanium, Lead, Zirconium, or combinations thereof;

wherein: (a) the pillar includes first and second surfaces that oppose each other; (b) the first surface couples the first and second sidewalls to one another; and (c) the second surface couples the first and second sidewalls to one another;

wherein: (a) the second layer directly contacts the first and second sidewalls; and (b) the second layer directly contacts the first surface.

2. The system of claim 1 comprising a memory cell, the memory cell including the capacitor and the switching device.

3. The system of claim 2 wherein the second layer includes at least one of Strontium, Titanium, Niobium, or combinations thereof.

4. The system of claim 1 wherein:
a first plane intersects the substrate but none of the first, second, third, fourth, fifth, or sixth layers;
a second plane intersects the first sidewall, the second sidewall, and the second, third, fourth, and fifth layers; and
the first plane is parallel to the second plane.

5. The system of claim 4 comprising a third plane, wherein:
the third plane is orthogonal to the first plane;
the third plane intersects the first and second surfaces;
the third plane does not intersect the first sidewall;
the third plane does not intersect the second sidewall.

6. The system of claim 5 wherein the third plane intersects the first, second, third, fourth, fifth, and sixth layers.

7. The system of claim 6 wherein the fourth layer directly contacts the third and fifth layers.

8. The system of claim 4 wherein:
the second layer is less than 10 nm thick, thickness being defined in a direction orthogonal to the first plane;
the third layer is less than 20 nm thick;
the fourth layer is less than 100 nm thick; and
the fifth layer is less than 20 nm thick.

9. The system of claim 4 comprising:
additional first, additional second, additional third, additional fourth, additional fifth, and additional sixth layers, (a) the additional first layer being between the substrate and the additional sixth layer, and (b) the additional fourth layer being between the additional third and additional fifth layers;
an additional pillar between the additional first and additional second layers, the additional pillar including: (a) an additional material that is non-amorphous; and (b) additional first and additional second sidewalls that oppose one another;
an additional capacitor between the additional second and additional sixth layers, the additional capacitor including: (a) the additional third, additional fourth, and additional fifth layers, and (b) another electrode that includes the additional third layer and a supplemental electrode that includes the additional fifth layer; and
an additional switching device between the additional first and additional sixth layers;
wherein: (a) the additional first layer includes the metal and the additional sixth layer includes the metal, (b) the additional fourth layer includes at least one of Bismuth, Iron, Lutetium, Titanium, Lead, Zirconium, or combinations thereof, and (c) the second plane intersects the additional first sidewall, the additional second sidewall, and the additional second, additional third, additional fourth, and additional fifth layers.

10. The system of claim 2 wherein the switching device comprises a source region, a channel region, and a drain region.

11. The system of claim 2 comprising a bit line, wherein the switching device couples the capacitor to the bit line.

12. The system of claim 11 wherein:
the bit line is between the capacitor and the first layer;
the bit line includes the pillar;
the material that is non-amorphous is doped.

13. The system of claim 12 comprising:
an additional switching device between the substrate and sixth layers;
an interconnect line that couples the switching device and the additional switching device to each other; and
the additional switching device is not included in any memory cell.

14. The system of claim 13 wherein the additional switching device is included in at least one of a sense amplifier or a multiplexor (MUX).

15. The system of claim 13 wherein:
the switching device is an NMOS transistor;
the additional switching device is an additional NMOS transistor;
the switching device and the additional switching device are included in a layer; and
the layer does not include a PMOS transistor.

16. The system of claim 2 wherein:
a majority of the material of the pillar is non-amorphous;
the material of the pillar includes silicon;
the metal includes at least one of copper, aluminum, cobalt, tungsten, or combinations thereof.

17. The system of claim 1 wherein a majority of the capacitor is not included in a trench.

18. A system comprising:
first, second, third, fourth, fifth, and sixth layers, (a) the second, third, fourth, and fifth layers being between the first and sixth layers, and (b) the fourth layer being between the third and fifth layers;
a formation between the first and second layers, the formation including: (a) a material that is non-amorphous; and (b) first and second sidewalls;
a capacitor between the second and sixth layers, the capacitor including: (a) the third, fourth, and fifth layers, and (b) an electrode that includes the third layer and an additional electrode that includes the fifth layer; and
a switching device between the first and sixth layers;
wherein: (a) the first layer includes a metal and the sixth layer includes the metal, and (b) the fourth layer includes a Perovskite material;
wherein: (a) the formation includes first and second surfaces that oppose each other; (b) the first surface couples the first and second sidewalls to one another; and (c) the second surface couples the first and second sidewalls to one another;
wherein: (a) the second layer directly contacts the first and second sidewalls; and (b) the second layer directly contacts the first surface.

19. The system of claim 18 comprising a memory cell, the memory cell including the capacitor and the switching device.

* * * * *